United States Patent
Schwindt et al.

(10) Patent No.: US 8,212,556 B1
(45) Date of Patent: Jul. 3, 2012

(54) ATOMIC MAGNETOMETER

(75) Inventors: Peter Schwindt, Albuquerque, NM (US); Cort N. Johnson, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 356 days.

(21) Appl. No.: 12/686,109

(22) Filed: Jan. 12, 2010

(51) Int. Cl.
*G01V 3/00* (2006.01)
(52) U.S. Cl. .......................... 324/304; 324/301
(58) Field of Classification Search .......... 324/300–260; 600/407–422
See application file for complete search history.

(56) References Cited

U.S. PATENT DOCUMENTS

| | | | | |
|---|---|---|---|---|
| 6,472,869 | B1 * | 10/2002 | Upschulte et al. | 324/304 |
| 7,038,450 | B2 | 5/2006 | Romalis et al. | |
| 7,483,130 | B2 * | 1/2009 | Baumberg et al. | 356/301 |
| 7,489,134 | B2 * | 2/2009 | Reiderman | 324/339 |
| 7,521,928 | B2 * | 4/2009 | Romalis et al. | 324/304 |
| 7,826,065 | B1 * | 11/2010 | Okandan et al. | 356/521 |
| 2009/0039881 | A1 | 2/2009 | Kitching et al. | |
| 2009/0243610 | A1 | 10/2009 | Ichihara et al. | |
| 2010/0156419 | A1 * | 6/2010 | Sugioka | 324/318 |
| 2010/0308814 | A1 * | 12/2010 | Wu | 324/244.1 |
| 2011/0025323 | A1 * | 2/2011 | Budker et al. | 324/304 |
| 2011/0031969 | A1 * | 2/2011 | Kitching et al. | 324/304 |
| 2011/0193555 | A1 * | 8/2011 | Sugioka et al. | 324/244.1 |

OTHER PUBLICATIONS

K. Kominis, et al., "A subfemototesia multichannel atomic magnetometer", Nature, vol. 422, Apr. 10, 2003, pp. 596-599.

P.D. D. Schwindt et al., "Self-oscillating rubidium magnetometer using nonlinear magneto-optical rotation", Review of Scientific Instruments, vol. 76, (2005) 126103-1 thru -4.

J. M. Higbie. et al, "Robust, high-speed, all-optical atomic magnetometer", Review of Scientific Instruments, vol. 77, (2006) 113106-1 thru -7.

H. Xiz et al, "Magnetoencephalography with an atomic magnetometer", Applied Physics Letters, vol. 87, (2006) 211104-1 thru -3.

Vishal Shah et al., Subpicotesia atomic magnetometry with a microfabricated vapour cell, 2007, Letters, nature photonics, vol. 1, pp. 649-652.

V. Shah et al, "Spin-exchange relaxation-free magnetometry using elliptically polarized light," Physical Review A, vol. 80, (2009), pp. 013416-1 thru 6.

* cited by examiner

*Primary Examiner* — Brij Shrivastav
(74) *Attorney, Agent, or Firm* — Lowell Carson

(57) ABSTRACT

An atomic magnetometer is disclosed which uses a pump light beam at a D1 or D2 transition of an alkali metal vapor to magnetically polarize the vapor in a heated cell, and a probe light beam at a different D2 or D1 transition to sense the magnetic field via a polarization rotation of the probe light beam. The pump and probe light beams are both directed along substantially the same optical path through an optical waveplate and through the heated cell to an optical filter which blocks the pump light beam while transmitting the probe light beam to one or more photodetectors which generate electrical signals to sense the magnetic field. The optical waveplate functions as a quarter waveplate to circularly polarize the pump light beam, and as a half waveplate to maintain the probe light beam linearly polarized.

35 Claims, 8 Drawing Sheets

ATOMIC MAGNETOMETER

GOVERNMENT RIGHTS

This invention was made with Government support under Contract No. DE-AC04-94AL85000 awarded by the U.S. Department of Energy. The Government has certain rights in the invention.

CROSS REFERENCE TO RELATED APPLICATIONS

The present application is related to U.S. patent application Ser. No. 12/173,547, entitled "Tuned Optical Cavity Magnetometer," of common assignee filed on Jul. 15, 2008, the contents of which are incorporated herein by reference in their entirety.

FIELD OF THE INVENTION

The present invention relates in general to magnetometers, and in particular to atomic magnetometers which rely on optically polarizing an alkali metal vapor and optically probing the state of magnetization of the polarized alkali metal atoms to sense a magnetic field.

BACKGROUND OF THE INVENTION

High sensitivity detection of magnetic fields is critical to many applications including ordinance detection, geophysical mapping, navigation, and the detection of bio-magnetic fields associated with heart and brain activity. Conventional superconducting magnetometers based on superconducting quantum interference devices (SQUIDs) provide a high sensitivity for magnetic field detection but are bulky and require expensive cryogenic cooling. Atomic magnetometers, which are based on optical measurements of unpaired electron spin in an alkali metal vapor are being developed. These atomic magnetometers do not require cryogenic cooling and are capable of measuring the absolute magnetic field at high sensitivity (down to less than one femtoTesla).

The present invention provides an advance in the art of atomic magnetometers by providing an atomic magnetometer in which a pump light beam and a probe light beam are directed in substantially the same direction. This is useful to reduce lateral dimensions of the atomic magnetometer as compared to other types of atomic magnetometers. Additionally, the atomic magnetometers of the present invention provide a capability of sensing magnetic fields at an arbitrary angle orthogonal an optical path of the pump and probe light beams, whereas other types of atomic magnetometers in which the pump light beam is orthogonal to the probe light beam are limited to sensing a magnetic field in a single direction.

The present invention also utilizes two different wavelengths for the pump and probe light beams which allows the pump light beam to be blocked with an optical filter while allowing the probe light beam to be transmitted through the optical filter and detected to sense the magnetic field.

The atomic magnetometer of the present invention can be used with free-space or fiber optic delivery of the pump and probe light beams thereby allowing lasers used to generate the pump and probe light beams to be located at a distance from the atomic magnetometer. The use of fiber optic delivery of the pump and probe light beams is also advantageous to allow a plurality of atomic magnetometers to be supplied with pump and probe light beams from a single pair of lasers, with the pump and probe light beams being split and separately sent through optical fibers to each magnetometer.

These and other advantages of the present invention will become evident to those skilled in the art.

SUMMARY OF THE INVENTION

The present invention relates to an atomic magnetometer for sensing a magnetic field. The atomic magnetometer comprises a cell containing an alkali metal vapor (e.g. sodium, potassium, rubidium or cesium). In the atomic magnetometer, a pump light beam having a first wavelength which is substantially equal to the wavelength of a first D-line atomic transition of the alkali metal vapor is directed through an optical waveplate and through the cell containing the alkali metal vapor to magnetically polarize the alkali metal vapor. The atomic magnetometer also includes a probe light beam having a second wavelength which is different from the first wavelength, with the second wavelength being substantially equal to the wavelength of a second D-line atomic transition of the alkali metal vapor. The probe light beam is directed through the optical waveplate and through the cell containing the alkali metal vapor and undergoes a change in polarization due to the magnetic field. An optical filter is located in a path of the pump light beam and the probe light beam to block transmission of the pump light beam, and to transmit the probe light beam to one or more photodetectors which are used to detect the probe light beam and to generate therefrom an electrical signal which depends upon the change in polarization of the probe light beam due to the magnetic field.

The pump light beam and the probe light beam are directed in substantially the same direction through the cell containing the alkali metal vapor. In some embodiments of the present invention, the path of the pump light beam and the probe light beam is a straight optical path. In other embodiments of the present invention, the path of the pump light beam and the probe light beam is a folded optical path, with an optical reflector being located proximate to the cell to re-direct the pump light beam and the probe light beam along the folded optical path to the optical filter.

The pump light beam can be provided by a laser and can be coupled through an optical fiber prior to being directed through the optical waveplate and through the cell containing the alkali metal vapor. The probe light beam can be provided by another laser and can be coupled through the same optical fiber or a different optical fiber prior to being directed through the optical waveplate and through the cell containing the alkali metal vapor.

The pump light beam and the probe light beam can both be linearly polarized prior to being directed through the optical waveplate. The optical waveplate then circularly polarizes the pump light beam, while the probe light beam remains linearly polarized after transmission through the optical waveplate. The optical waveplate can be a high-order optical waveplate which functions as a quarter waveplate at the first wavelength (i.e. the wavelength of the pump light beam) and as a half waveplate at the second wavelength (i.e. the wavelength of the probe light beam).

Both the pump light beam and the probe light beam can be substantially collimated prior to entry into the cell containing the alkali metal vapor. This can be done by using one or more lenses in the atomic magnetometer.

The optical filter can comprise an optical interference filter, and can further include a polarization beamsplitter.

The cell containing the alkali metal vapor can be located within an oven; and the oven can optionally be located inside of an evacuated enclosure.

In certain embodiments of the present invention, each photodetector can be a multi-element photodetector. This is useful, for example, to sense the magnetic field at various locations within the cell containing the alkali metal vapor.

One or more sets of magnetic coils can be located about the cell containing the alkali metal vapor. These magnetic coils can be used to substantially cancel a background magnetic field, or to modulate the magnetic field within the cell to improve a signal-to-noise ratio for detecting the magnetic field.

The present invention also relates to an atomic magnetometer for sensing a magnetic field which comprises a cell containing an alkali metal vapor. In the atomic magnetometer, a pump light beam having a first wavelength which is substantially equal to the wavelength of a first D-line atomic transition of the alkali metal vapor is directed along an optical path through an optical waveplate and through the cell containing the alkali metal vapor, with the pump light beam being circularly polarized by the optical waveplate to magnetically polarize the alkali metal vapor. The atomic magnetometer also includes a probe light beam having a second wavelength which is different from the first wavelength, with the second wavelength being substantially equal to the wavelength of a second D-line atomic transition of the alkali metal vapor. The probe light beam is directed along the optical path through the optical waveplate and through the cell containing the alkali metal vapor, with the probe light beam being linearly polarized after transmission through the optical waveguide, and with the alkali metal vapor in response to the magnetic field changing a polarization angle of the linearly-polarized probe light beam. A light reflector is located in the optical path to reflect the pump light beam and the probe light beam back through the cell containing the alkali metal vapor to an optical filter which transmits the probe light beam and blocks the pump light beam. One or more photodetectors in the atomic magnetometer then detect the change in the polarization angle of the linearly-polarized light beam to determine an intensity of the magnetic field. The alkali metal vapor can comprise an alkali metal selected from the group consisting of sodium, potassium, rubidium and cesium.

The pump light beam can be provided by a laser and can be coupled through an optical fiber to the optical path. The probe light beam can be provided by another laser and can be coupled through the same optical fiber or through a different optical fiber to the optical path. The optical fiber can be either a polarization-maintaining optical fiber, or a multi-mode optical fiber. If needed, the pump light beam and the probe light beam can both be linearly polarized by a linear polarizer after exiting the optical fiber and before being directed through the optical waveplate. A lens can also be located within the optical path to substantially collimate the pump light beam and the probe light beam prior to entry of the pump light beam and the probe light beam into the cell.

The optical waveplate can be a high-order optical waveplate which functions as a quarter waveplate at the first wavelength and as a half waveplate at the second wavelength.

The optical filter can comprise an optical interference filter, and can further include a polarization beamsplitter.

The cell containing the alkali metal vapor can be located inside of an oven. In certain embodiments of the present invention, the oven can be located within an evacuated enclosure.

Each photodetector can be a single-element photodetector, or a multi-element photodetector.

The present invention further relates to an atomic magnetometer for sensing a magnetic field, comprising: a cell containing an alkali metal vapor (e.g. sodium, potassium, rubidium or cesium); an optical fiber emitting a pump light beam and a probe light beam from an exit end of the optical fiber, with the emitted pump and probe light beams being collinear and directed along an optical path through the cell, and with the pump light beam having a wavelength substantially equal to the wavelength of a first D-line atomic transition of the alkali metal vapor, and with the wavelength of the probe light beam being substantially equal to the wavelength of a second D-line atomic transition of the alkali metal vapor; a lens located in the optical path of the pump and probe light beams to substantially collimate the pump and probe light beams; an optical waveplate located in the optical path of the pump and probe light beams, with the optical waveplate functioning as a quarter waveplate at the wavelength of the first D-line atomic transition of the alkali metal vapor and as a half waveplate at the wavelength of the second D-line atomic transition of the alkali metal vapor; a light reflector located in the optical path on a side of the cell opposite the optical fiber to reflect the pump and probe beams back through the cell to an optical filter which transmits the probe light beam and blocks the pump light beam; and at least one photodetector to detect the probe light beam after transmission through the optical filter and to generate therefrom an electrical signal which depends upon the magnetic field.

The cell containing the alkali metal vapor can be located inside of an oven; and the oven can optionally be located within an evacuated enclosure. A fluid-cooled member can be provided in contact with an outer surface of the evacuated enclosure. This can be useful, for example, when the atomic magnetometer is used to sense a bio-magnetic field.

The pump light beam can be generated by a first laser; and the probe light beam can be generated by a second laser.

Each photodetector can be a single-element photodetector, or a multi-element photodetector.

One or more sets of magnetic coils can be located about the cell to modulate an interaction between the magnetic field and the alkali metal vapor and thereby modulate the electrical signal generated by each photodetector. This is useful for synchronous detection of each electrical signal using, for example, a lock-in amplifier.

Additional advantages and novel features of the invention will become apparent to those skilled in the art upon examination of the following detailed description thereof when considered in conjunction with the accompanying drawings. The advantages of the invention can be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several aspects of the present invention and, together with the description, serve to explain the principles of the invention. The drawings are only for the purpose of illustrating preferred embodiments of the invention and are not to be construed as limiting the invention. In the drawings.

DETAILED DESCRIPTION OF THE INVENTION

Figure 1:
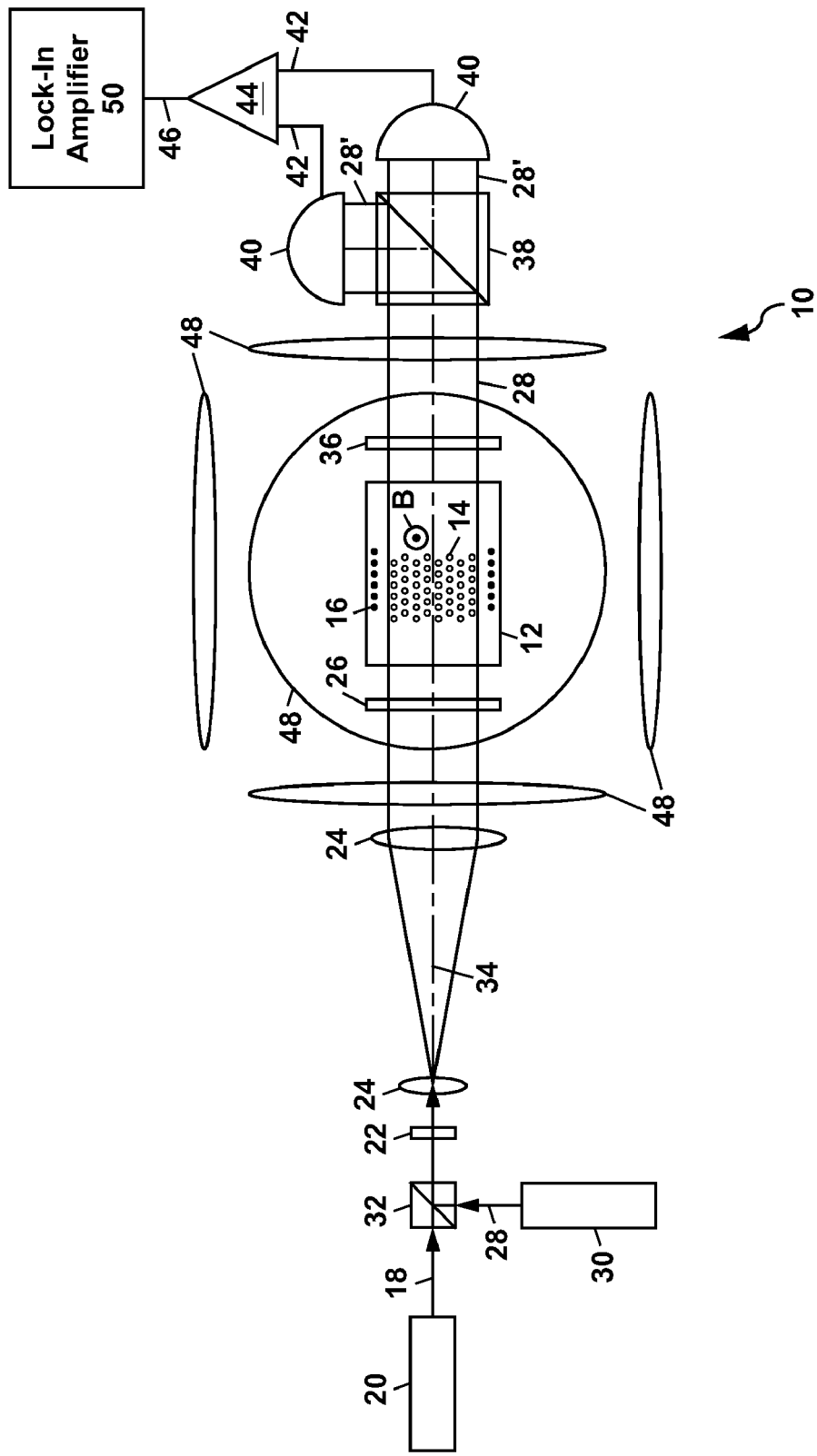
FIG. 1 shows a schematic plan view of a first example of an atomic magnetometer for sensing a magnetic field according to the present invention.

FIG. 1 shows a schematic diagram of a first example of an atomic magnetometer 10 for sensing a magnetic field according to the present invention. This apparatus 10, which is also referred to herein as a magnetometer 10, comprises a cell 12 containing an alkali metal vapor 14. The cell 12, which can be made of glass, can also include a buffer gas 16 (e.g. comprising a noble gas such as helium or neon). Another gas such as nitrogen can also be added to the buffer gas 16. The cell 12 can be heated to a elevated temperature to provide a density of alkali metal atoms in the vapor 14 which can range from about $10^{11}$ cm$^{-3}$ to $10^{15}$ cm$^{-3}$ or more. The exact temperature to which the cell 12 is heated will depend, in general, upon the alkali metal (e.g. sodium, potassium, rubidium, or cesium) which is used in the apparatus 10. As an example, when the alkali metal comprises rubidium-87, the cell 12 can be heated up to about 200° C. The cell 12 can be heated by locating the cell 12 within an oven (see FIG. 3). The oven has been omitted from FIG. 1 to better show other details of the atomic magnetometer 10.

In the atomic magnetometer 10, a pump light beam 18, which can be generated by a laser 20 is directed through a linear polarizer 22 to linearly polarize the pump light beam 18. The linear polarizer 22 can be omitted if the pump light beam 18 is already linearly polarized by the laser 20. The pump light beam 18, which can have an optical power level of up to a few milliWatts (mW) or more depending upon the size of the cell 12, can then be expanded and substantially collimated by one or more lenses 24. The pump light beam 18 can be expanded, for example, to a size which fills a majority of the internal volume of the cell 12 which can have lateral dimensions of generally about one inch or smaller.

After being expanded and substantially collimated by the lenses 24, the pump light beam 18 in FIG. 1 is directed through an optical waveplate 26 having a fast axis which is oriented at 45° with respect to a direction (e.g. vertical out of the plane of FIG. 1 or horizontal in the plane of FIG. 1) of the linear polarization of the pump light beam 18. After being transmitted through the optical waveplate 26, the pump light beam 18 is directed through the cell 12 containing the alkali metal vapor 14.

The optical waveplate 26 functions as a quarter waveplate at the wavelength of the pump light beam 18 which is substantially equal to the wavelength of a first D-line atomic transition of the alkali metal vapor 14. In this way, the optical waveplate 26 converts the pump light beam 18, which was initially linearly polarized, into being circularly polarized. The circularly-polarized light in the beam 18 after passing through the optical waveplate 26 can be either right-handed circularly-polarized light or left-handed circularly-polarized light.

The first D-line atomic transition of the pump light beam 18 can be either a D1 atomic transition (also referred to herein as a D1 transition or a D1 line) defined herein as a transition from a $n^2S_{1/2}$ ground state to a $m^2P_{1/2}$ excited state of the alkali metal atoms in the vapor 14 where n and m are integers, or a D2 atomic transition (also referred to herein as a D2 transition or a D2 line) defined herein as a transition from a $n^2S_{1/2}$ ground state to a $m^2P_{3/2}$ excited state of the alkali metal atoms in the vapor 14 where n and m are integers. The wavelengths of the lowest-lying D1 and D2 transitions for various alkali metals are listed in the table below:

| Alkali Metal | D1 Wavelength (nm) | D2 Wavelength (nm) |
| --- | --- | --- |
| Sodium | 590 | 589 |
| Potassium | 770 | 767 |
| Rubidium | 795 | 780 |
| Cesium | 894 | 852 |

The pump light beam 18 need not be exactly on line center of the D1 or D2 transition, which has a Lorentzian line shape with a full-width-at-half-maximum (FWHM) which can be up to 10-20 gigaHertz (GHz) due to pressure broadening by the buffer gas 16, but can be tuned off of the line center and onto the wings of the Lorentzian line shape by a fraction of a nanometer (e.g. by up to several tens of GHz). This tuning of the pump light beam 18 slightly off of the line center of the D1 or D2 transition and onto the wings of the Lorentzian line shape for the D1 or D2 transition can be useful to reduce the absorption of the pump light beam 18 by the alkali metal vapor 14 thereby allowing the pump light beam 18 to be transmitted through the cell 12, or in some cases, allowing the pump light beam 18 to pass through the cell 12 more than once (e.g. when a folded optical path is used). Similarly, a probe light beam 28 used in the atomic magnetometer 10 does not need to be tuned exactly onto the line center of the D2 or D1 transition, but can be tuned off the line center by up to a significant fraction of a nanometer (e.g. by up to several hundred GHz).

As used herein, the term "substantially equal to the wavelength of a D-line transition" means that the pump or probe light beam has a wavelength which is sufficiently near to the D1 or D2 transition so that there is an interaction between the pump or probe light beam 18 or 28, respectively, and the alkali metal vapor 14. In the case of the pump light beam 18, this interaction results in absorption of at least a part of the pump light beam 18 by the alkali metal vapor 14. In the case of the probe light beam 28, this interaction results in a change in an index of refraction of the alkali metal vapor 14 which produces an angular rotation in the direction of the linear polarization of the probe light beam 28 (also termed a Faraday rotation).

The circular polarization of the pump light beam 18 produced by the optical waveplate 26 is used to align the nuclear and electron spins of the individual alkali metal atoms in the alkali metal vapor 14. This can be understood with reference to FIGS. 2A-2C.

Figure 2A:
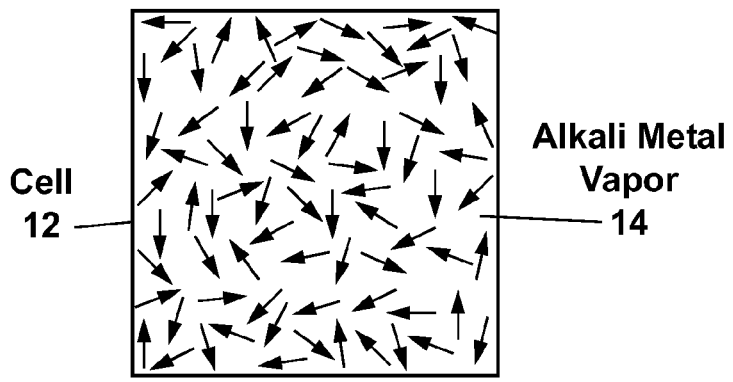
FIG. 2A schematically illustrates an initial random alignment of the spins of the alkali metal atoms in the cell of the atomic magnetometer of FIG. 1, with an axis of the spins of the alkali metal atoms being indicated by the arrows.

In FIG. 2A, each alkali metal atom in the vapor 14 in the cell 12 initially has a spin axis (also referred to as a spin) which is randomly polarized in the absence of the circularly-polarized pump light beam 18. This is schematically illustrated by the arrows in FIG. 2A.

Figure 2B:
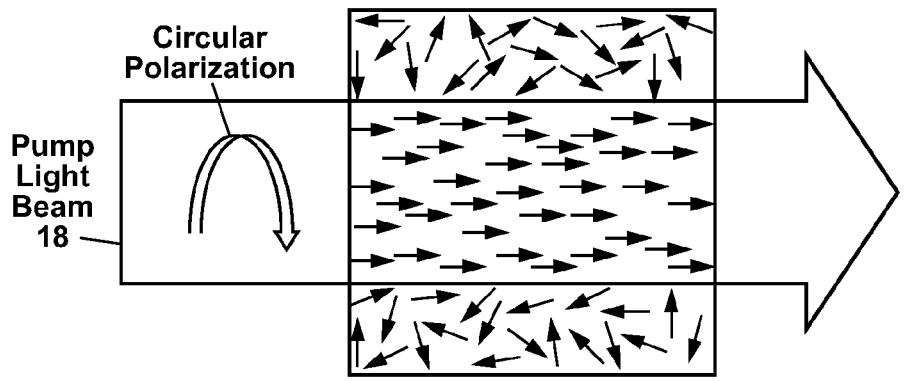
FIG. 2B schematically illustrates the magnetic polarization of the spins of the alkali metal atoms in the cell of the atomic magnetometer of FIG. 1 which is produced by optical pumping of certain of the alkali metal atoms using a circularly-polarized pump light beam.

The optical pumping of the alkali metal vapor 14 by the circularly-polarized pump light beam 18 re-orients the spins of the individual alkali metal atoms so that they are in a magnetically-polarized state with the spin of each alkali metal atom being aligned along the direction of the pump light beam 18 (i.e. along an optical axis defined by the pump light beam 18). This is indicated by the horizontal arrows in FIG. 2B. The alkali metal atoms located outside of the pump light beam 18 remain randomly polarized as shown in FIG. 2B.

The noble gas (e.g. helium or neon) which is provided in the buffer gas 16 in the cell 12 is useful to slow down the rate at which the atoms of the alkali metal vapor 14 collide with the inner walls of the cell 12 which can again randomize the spins of the alkali metal atoms. The noble gas can be, for example, at a pressure of about 60-100 kiloPascals (kPa). The buffer gas 16 can also contain nitrogen which is useful to quench the $n^2P_{1/2}$ or $n^2P_{3/2}$ excited state resulting pumping at the D1 or D2 line by the pump light beam 18 and thereby relax the metal vapor atoms back into the magnetically-polarized $n^2S_{1/2}$ ground state at a more rapid rate. The nitrogen can be, for example, at a pressure of about 4 kPa.

Figure 2C:
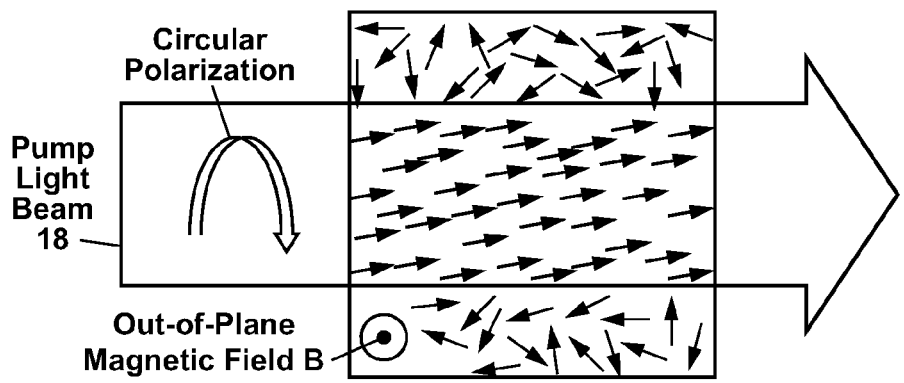
FIG. 2C schematically illustrates the rotation of the spins of the magnetically-polarized alkali metal atoms in FIG. 2B in the presence of a magnetic field B which is in a direction substantially orthogonal to the pump light beam.

In FIG. 2C, a magnetic field B which passes through the cell 12 and is directed substantially orthogonally to the pump light beam 18 will interact with the magnetically-polarized alkali metal vapor 14 to generate in a torque on the spins of the alkali metal atoms which have been magnetically polarized along the optical axis by the pump light beam 18. This torque due to the magnetic interaction with the alkali metal atoms causes the spins of the alkali metal atoms to be rotated at an angle with respect to the optical axis of the pump light beam 18 as shown in FIG. 2C. The exact angle of the spins of the alkali metal atoms relative to optical axis of the pump light beam 18 will depend upon the effects of the competing effects of optical pumping by the light beam 18, which polarizes the atomic spins, and magnetic spin precession, which causes the atomic spins to precess away from the optical axis at the Larmor frequency. In FIGS. 1 and 2C, the magnetic field B is shown as being substantially perpendicular to the plane of FIGS. 1 and 2C and is indicated by a circle with a dot therein. However, those skilled in the art will understand that the magnetic field B can be rotated about an optical path 34 of the pump light beam 18 at an arbitrary angle between 0° and 360° and still interact with the alkali metal vapor 14 so long as the magnetic field B or a component thereof is substantially orthogonal to the pump light beam 18.

The atomic magnetometer 10 of the present invention detects the rotation of the alkali metal atoms in the vapor 14 by using a probe light beam 28 from another laser 30. The probe light beam 28 can have a wavelength which is substantially equal to the wavelength of the D2 line of the alkali metal vapor 14 when the pump light beam is at the wavelength of the D1 line, or alternately can have a wavelength which is substantially equal to the wavelength of the D1 line of the alkali metal vapor 14 when the pump light beam is at the wavelength of the D2 line. The optical power level of the probe light beam 28 can be up to a few mW or more.

The lasers 20 and 30 used to generate the pump and probe light beams 18 and 28 can be, for example, distributed feedback (DFB) lasers or vertical-cavity surface emitting lasers (VCSELs). Those skilled in the art will understand that other types of lasers can be used to generate the pump and probe light beams 18 and 28, including titanium sapphire lasers and organic dye lasers.

In some cases, it may be possible to generate the pump and probe light beams 18 and 28, respectively, using a single laser. This can be done, for example, by using a multi-longitudinal-mode VCSEL or DFB laser having a longitudinal mode spacing which is substantially equal to a wavelength difference between the D1 and D2 lines of the alkali metal so that one longitudinal mode can be used to provide the pump light beam 18 and an adjacent longitudinal mode can be used to provide the probe light beam 28.

The probe light beam 28 can be made substantially collinear with the pump light beam 18. This can be done using an optical beam-combining element 32 which can be, for example, a beamsplitter, mirror, prism, diffraction grating, or optical fiber coupler. In the example of FIG. 1, a dichroic prism beamsplitter is shown.

The probe light beam 28 follows the optical path 34 of the pump light beam 18 through the linear polarizer 22, the lenses 24, the optical waveplate 26 and through the cell 12 containing the alkali metal vapor 14. At the wavelength of the probe light beam 28, the optical waveplate 26 functions as a half waveplate which rotates the linear polarization of the probe light beam 28 by an angle of 90° while maintaining the probe light beam 28 in a linear polarization state.

In order for the optical waveplate 26 to function both as a quarter waveplate (i.e. a $\lambda/4$ plate) for the pump light beam 18 and as a half waveplate (i.e. a $\lambda/2$ plate) for the probe light beam 28, the optical waveplate 26 will generally be a high-order optical waveplate 26. As an example, when the alkali metal vapor 14 comprises rubidium, the high-order optical waveplate 26 can be made of crystalline quartz with a thickness 1.09 millimeters to provide an optical retardation of 12.25 waves at 795 nm (i.e. the D1 wavelength) for the pump light beam 18 and an optical retardation of 12.5 waves at 780 nm (i.e. the D2 wavelength) for the probe light beam 28. Those skilled in the art will understand that other types of birefringent materials can be used for the optical waveplate 26, and will also understand that the exact number of waves of optical retardation for the pump and probe light beams 18 and 28 will depend upon the alkali metal used to form the vapor 14.

Figure 2D:
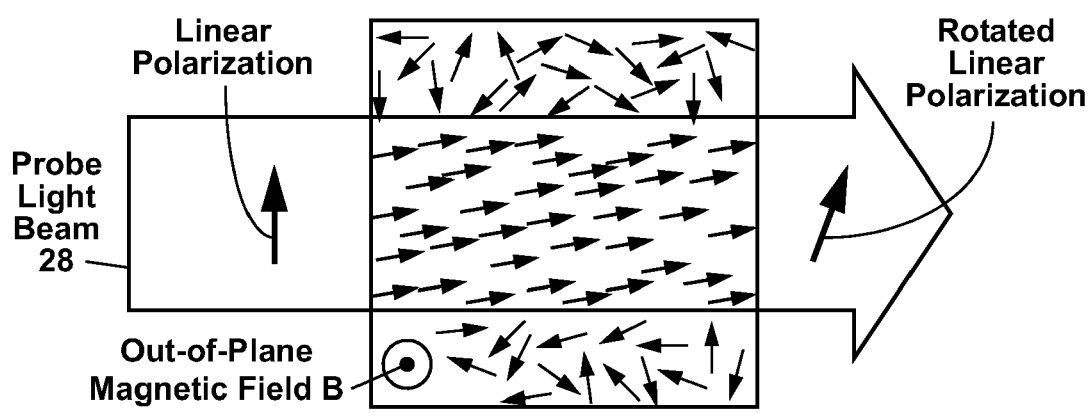
FIG. 2D schematically illustrates an angular rotation of the direction of linear polarization of the probe light beam which is results from the magnetically-polarized alkali metal atoms in the presence of the magnetic field B.

When the probe light beam 28 passes through the cell 12 containing the alkali metal vapor 14, which has been magnetically-polarized by the pump light beam 18 to become birefringent, the linear polarization of the probe light beam 28 will be rotated over an angle which depends upon a magnitude (i.e. strength) of the magnetic field B. This is schematically illustrated in FIG. 2D. By detecting the angular rotation of the linearly-polarized probe light beam 28, the atomic magnetometer 10 can be used to sense the magnetic field B.

An optical filter is provided in the atomic magnetometer 10 to separate the probe light beam 28 from the pump light beam 18 in preparation for detecting the angular rotation of the linearly-polarized probe light beam 28. The optical filter can comprise an optical interference filter 36 which transmits the probe light beam 28 while blocking the transmission of the pump light beam 18. To do this, a bandpass wavelength of the optical interference filter 36 can be centered on the wavelength of the probe light beam 28.

The optical filter can also comprise a polarization beamsplitter 38 which can be oriented at a 45° angle with respect to the polarization state of the probe light beam 28 in the absence of any magnetic field B. With this orientation, the polarization beamsplitter 38 splits the probe light beam 28 into two substantially-equal beams 28' in the absence of any magnetic field B to provide a balanced detection of the probe light beams 28' using a pair of photodetectors 40. Each photodetector 40, which can be, for example, a silicon photodetector or a III-V compound semiconductor photodetector, generates an electrical signal 42 which is proportional to an amount of the probe light beam 28' incident on that photodetector 40. The electrical signals 42 from the two photodetectors 40 in FIG. 1 are provided to a transimpedance amplifier 44 which differentially amplifies the electrical signals 42 from the photodetectors 40 to provide an output voltage signal 46. Any angular rotation of the linear polarization of the probe light beam 28 will result in a difference in intensity of the two beams 28' reaching the photodetectors 40; and this will produce a change in the output voltage signal 46, thereby providing an indication of the magnitude of the magnetic field B sensed by the atomic magnetometer 10.

In the example of FIG. 1, residual magnetic fields (e.g. due to the earth's magnetic field, or due to nearby equipment or ac electrical wiring) can interfere with operation of the atomic magnetometer 10 and reduce its sensitivity. These residual magnetic fields can be substantially canceled out using one or more sets of coils 48 located about the cell 12 containing the alkali metal vapor 14. The coils 48 can be electrically activated, as needed, with an electrical current to cancel out the residual magnetic fields. These residual magnetic fields can also be reduced by locating the atomic magnetometer 10 within magnetic shielding (e.g. a magnetically-shielded enclosure or room) which can comprise one or more layers of a high-permeability material such as mumetal.

Phase sensitive detection of the output voltage signal 46 can be also used in the atomic magnetometer 10 of FIG. 1 to discriminate against background noise and unwanted residual magnetic fields and thereby provide an improved sensitivity for detecting very small magnetic fields B such as bio-magnetic fields which can have a magnetic field strength (i.e. intensity) on the order of a few hundred femtoTesla or less. Phase sensitive detection can be performed in the atomic magnetometer 10 by modulating the electrical current to one or more sets of the coils 48 at a reference frequency of up to a few kiloHertz (kHz). This produces a modulated magnetic field component which can be used to synchronously detect a magnetic field B which is aligned with the modulated magnetic field component generated by the coils 48. This magnetic field component modulates the index of refraction of the alkali metal vapor 14 thus modulating the angular rotation of the linearly-polarized probe light beam 28 and producing a modulation at the reference frequency on the signals 42 and 46. This allows the use of a lock-in amplifier 50 to amplify the output voltage signal 46 at the reference frequency while filtering out noise and other unwanted signals which may be present in the signal 46 at other frequencies. In this mode of operation, the atomic magnetometer 10 is sensitive to magnetic fields B that are perpendicular to the optical path 34 and parallel to the direction of the modulation of the magnetic field produced by the coils 48. Thus, by switching between different sets of the coils 48, the magnetometer 10 can detect magnetic fields B which are oriented in different directions substantially perpendicular to the optical path 34 (i.e. at different directions in a range of 0° to 360° around the optical path 34).

The capability of the atomic magnetometer 10 of the present invention to sense magnetic fields B at any arbitrary angle which is substantially perpendicular to the common optical path 34 of the pump and probe light beams 18 and 28 provides an advantage over other types of atomic magnetometers which utilize a probe light beam which is orthogonal to the pump light beams. Due to the crossed arrangement of the pump and probe light beams in these other types of atomic magnetometers, these other types of magnetometers are restricted to measuring magnetic fields which are oriented in a single direction.

Figure 3:
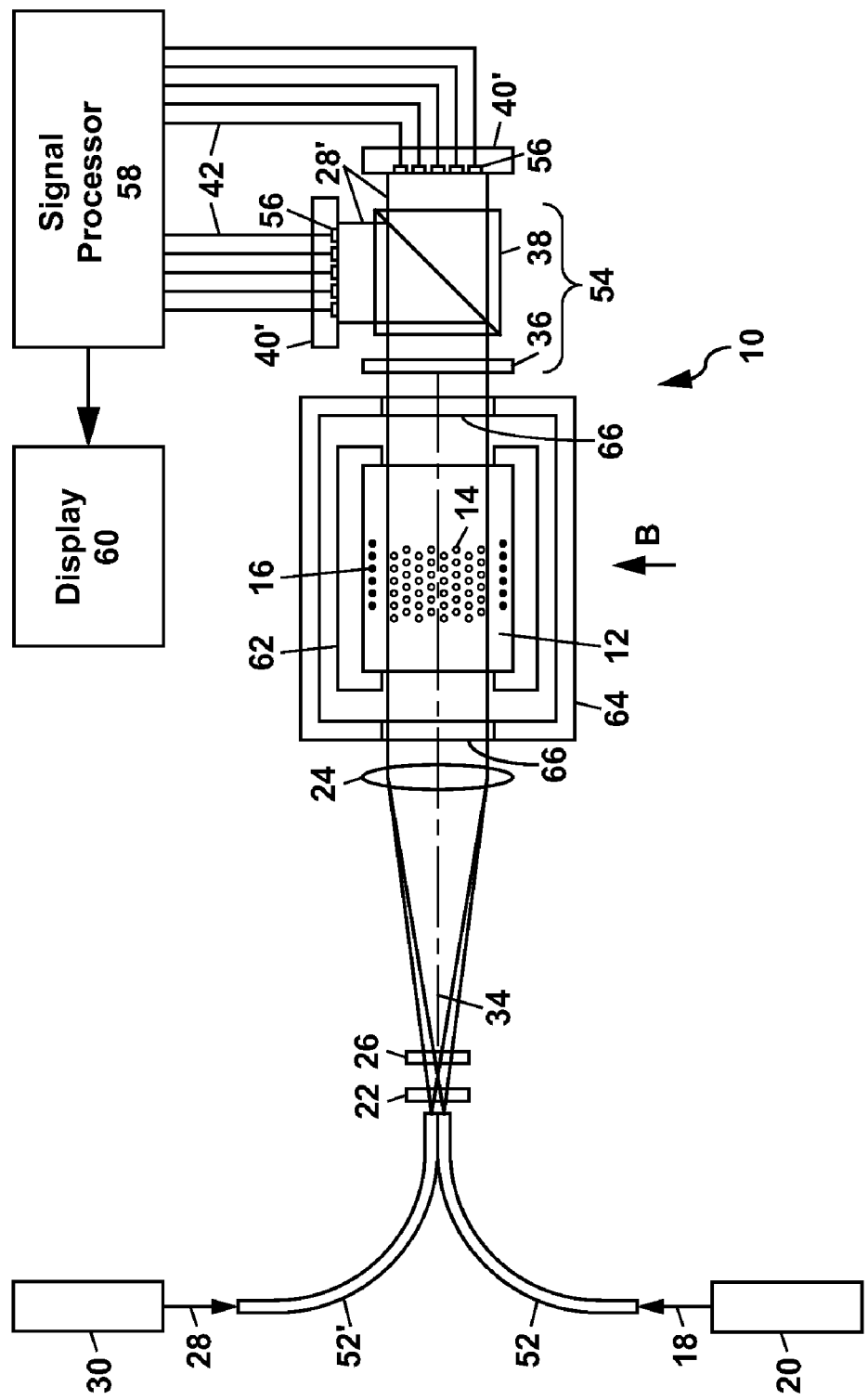
FIG. 3 shows a schematic diagram of a second example of the atomic magnetometer of the present invention.

FIG. 3 shows a schematic diagram of a second example of the atomic magnetometer 10 of the present invention. In the apparatus 10 of FIG. 3, the pump light beam 18 is generated by a laser 20 and is coupled into an optical fiber 52; and the probe light beam 28 is generated by another laser 30 and is coupled into a different optical fiber 52'. The two optical fibers 52 and 52' can comprise single-mode optical fibers, multi-mode optical fibers or polarization-maintaining optical fibers. Exit ends of the two optical fibers 52 and 52' can be located adjacent to each other as shown in FIG. 3 so that the pump light beam 18 and the probe light beam 28 will overlap and become substantially collinear after they are emitted from the two optical fibers 52 and 52'. In other embodiments of the present invention, the two optical fibers 52 and 52' can be connected together using an optical coupler (not shown) so that the pump and probe light beams 18 and 28, respectively, are combined and emitted out of a single optical fiber (e.g. the optical fiber 52 or 52', or a third optical fiber to which the optical fibers 52 and 52' are coupled).

In FIG. 3, if needed, a linear polarizer 22 can be located proximate to the exit end of the optical fibers 52 and 52' to linearly polarize the pump and probe light beams 18 and 28, respectively, after these beams are emitted from the exit end of the fibers 52 and 52'. In some cases, the linear polarizer 22 can be omitted (e.g. when the optical fibers 52 and 52' are polarization-maintaining optical fibers).

The pump and probe light beams 18 and 28, which are diverging upon exiting the optical fibers 52 and 52', can be collimated using one or more lenses 24 prior to entry of the beams 18 and 28 into the cell 12 containing the alkali metal vapor 14. By locating the lens 24 or an assembly of lenses 24 at a predetermined distance from the exit end of the optical fibers 52 and 52', the divergence of the pump and probe light beams 18 and 28 after exiting from the optical fibers 52 and 52' can be used to expand these beams 18 and 28 to a size which can be up to the lateral dimensions of the cell 12. The lateral dimensions of the cell 12 can range from a few millimeters to a few tens of millimeters.

Prior to entry into the cell 12 containing the alkali metal vapor 14, the pump light beam 18 is circularly polarized. This can be done by locating an optical waveplate 26 in an optical path 34 of the beam 18 either between the optical fiber 52 and the lens 24 as shown in FIG. 3, or alternately between the lens 24 and the cell 12 as shown in FIG. 1. The optical waveplate 26 can comprise a high-order optical waveplate as discussed previously with reference to FIG. 1, with the high-order optical waveplate functioning as a quarter waveplate at the wavelength of the pump light beam 18, and as a half waveplate at the wavelength of the probe light beam 28. This allows both the pump and probe light beams 18 and 28, respectively, to be transmitted through the same optical waveplate 26 and properly polarized.

In being transmitted through the cell 12 containing the alkali metal vapor 14, the circularly-polarized pump light beam 18, which has a wavelength substantially equal to the wavelength of the D1 or D2 line of the particular alkali metal provided in the cell 12, magnetically polarizes the alkali metal atoms so that the spins of these atoms are aligned along the direction of the pump light beam 18 (see FIG. 2B). A magnetic field B, which in the case of FIG. 3 is shown parallel to the plane of FIG. 3 and substantially orthogonal to the optical path 34 of the pump light beam 18, then interacts with the magnetically-polarized alkali metal vapor 14 to generate a torque on the spins of the alkali metal atoms and thereby rotate the spins of the atoms at an angle with respect to the pump light beam 18 as previously described with reference to FIG. 2C.

The effect of the magnetic field B on the magnetically-polarized alkali metal vapor 14 is sensed using the probe light beam 28 which is directed through the cell 12 along substantially the same optical path 34 as the pump light beam 18, with the linear polarization of the probe light beam 28 being rotated about an angle which is dependent upon the magnitude of the magnetic field B (see FIG. 2D). Upon exiting the cell 12, the pump light beam 18 is blocked by an optical filter 54 which comprises an optical interference filter 36. The optical filter 54 transmits the probe light beam 28 which then enters a polarization beamsplitter 38 which is considered herein to be a part of the optical filter 54. The polarization beamsplitter 38 then divides the probe light beam 28 into two substantially-equal beams 28' in the absence of any magnetic field B and directs these two beams 28' to separate photodetectors 40.

In the example of FIG. 3, each photodetector 40 comprises a multi-element photodetector 40' (also referred to as an array photodetector) having a one- or two-dimensional array of detector elements 56 formed, for example, from silicon or from a III-V compound semiconductor (e.g. gallium arsenide). Each individual detector element 56 acts as a separate photodetector to provide a spatially-resolved measurement of the magnetic field B sensed by the atomic magnetometer 10, thereby allowing the atomic magnetometer 10 to function as a magnetic gradiometer. With the magnetometer 10 operated as a gradiometer, common-mode magnetic fields can effectively be cancelled out through a gradiometric subtraction of the signals 42 or 46 from adjacent detector elements 56 of each multi-element photodetector 40' thereby increasing the sensitivity and selectivity for measuring magnetic field gradients.

The use of multi-element photodetectors 40' in the apparatus 10 of FIG. 3 can also provide a higher resolution for sensing the magnetic field B than is possible with a single-element photodetector 40. This is because each individual detector element 56 in the multi-element photodetectors 40' can view a different part of the probe light beam 28 and thereby sense the magnetic field B in a different part of the alkali metal vapor 14. Those skilled in the art will understand that each example of the atomic magnetometer 10 of the present invention described herein can be implemented with multi-element photodetectors 40'.

In the example of FIG. 3, an electrical signal 42 can be generated from each detector element 56 and provided to a signal processor 58 which is used to process the various electrical signals 42. The electrical signals 42 from each multi-element photodetector 40' can be output in series or in parallel as shown in FIG. 3.

The signal processor 58 can comprise a plurality of transimpedance amplifiers 44 (see FIG. 1), with each amplifier 44 receiving and differencing the electrical signals 42 from a detector element 56 in each of the two multi-element photodetectors 40' which detects the same part of the probe light beam 28 to provide an output voltage signal 46 which is nulled in the absence of any magnetic field B. When the electrical signals 42 are modulated by one or more sets of coils 48 to provide a reduced noise level and an enhanced detection sensitivity as previously described with reference to FIG. 1, the signal processor 58 can comprise a plurality of lock-in amplifiers 50 to synchronously detect the output voltage signals 46. Additionally, the signal processor 58 can include a computer to digitize and store information which can be used to determine the magnitude and direction of the magnetic field B (i.e. to determine gradients in the magnetic field B). This information about the magnetic field B can then be presented on a display 60 connected to the signal processor 58.

In the example of FIG. 3 and the other examples of the atomic magnetometer 10 presented herein, to control a density of the alkali metal atoms in the vapor 14, the cell 12 containing the alkali metal vapor 14 can be located within an oven 62 which heats the oven to an elevated temperature which can be, for example, up to about 200° C. or more depending upon the alkali metal used to provide the vapor 14 in the apparatus 10. The oven 62 can include one or more electrical resistance heaters and temperature sensors (e.g. thermistors) which are connected to a temperature control which can be used to operate the oven 62 and to stabilize the temperature of the cell 12 therein.

Thermal insulation can be provided around the oven 62. This thermal insulation can be a microporous ceramic insulation (e.g. MIN-K insulation) which can be a few millimeters thick (e.g. 3 mm).

The oven 62 can be also located inside of an evacuated enclosure 64 having one or more windows 66 as shown in FIG. 3. The enclosure 64 can be evacuated using a vacuum pump and then sealed. The use of an evacuated enclosure 64 containing the oven 62 and cell 12 can be advantageous to reduce 1/f noise in the atomic magnetometer 10 which may otherwise occur when the evacuated enclosure 64 is not used and the hot oven 62 and cell 12 are exposed to air. The 1/f noise is thought to be caused by fluctuations in the index of refraction of the air in the optical path 34 due to air convection currents produced by the hot oven 62 and cell 12. This 1/f noise, when present, dominates at frequencies of about 20 Hertz (Hz) and lower and can limit the sensitivity of the atomic magnetometer 10. However, by locating the oven 62 and cell 12 in the evacuated enclosure 64 with the air removed, the air convection currents should be eliminated thereby reducing the 1/f noise and increasing the sensitivity of the magnetometer 10.

Active cooling of one or more outer surfaces of the evacuated enclosure 64 can also be provided when needed, for example, when the atomic magnetometer 10 is used to measure bio-magnetic fields and must be brought in close proximity to a human or animal body. This active cooling can be provided, for example, by a fluid-cooled member 68 (e.g. a water-cooled pad) which is located in contact with or attached to one or more of the outer surfaces of the enclosure 64 (see FIG. 5).

Figure 4:
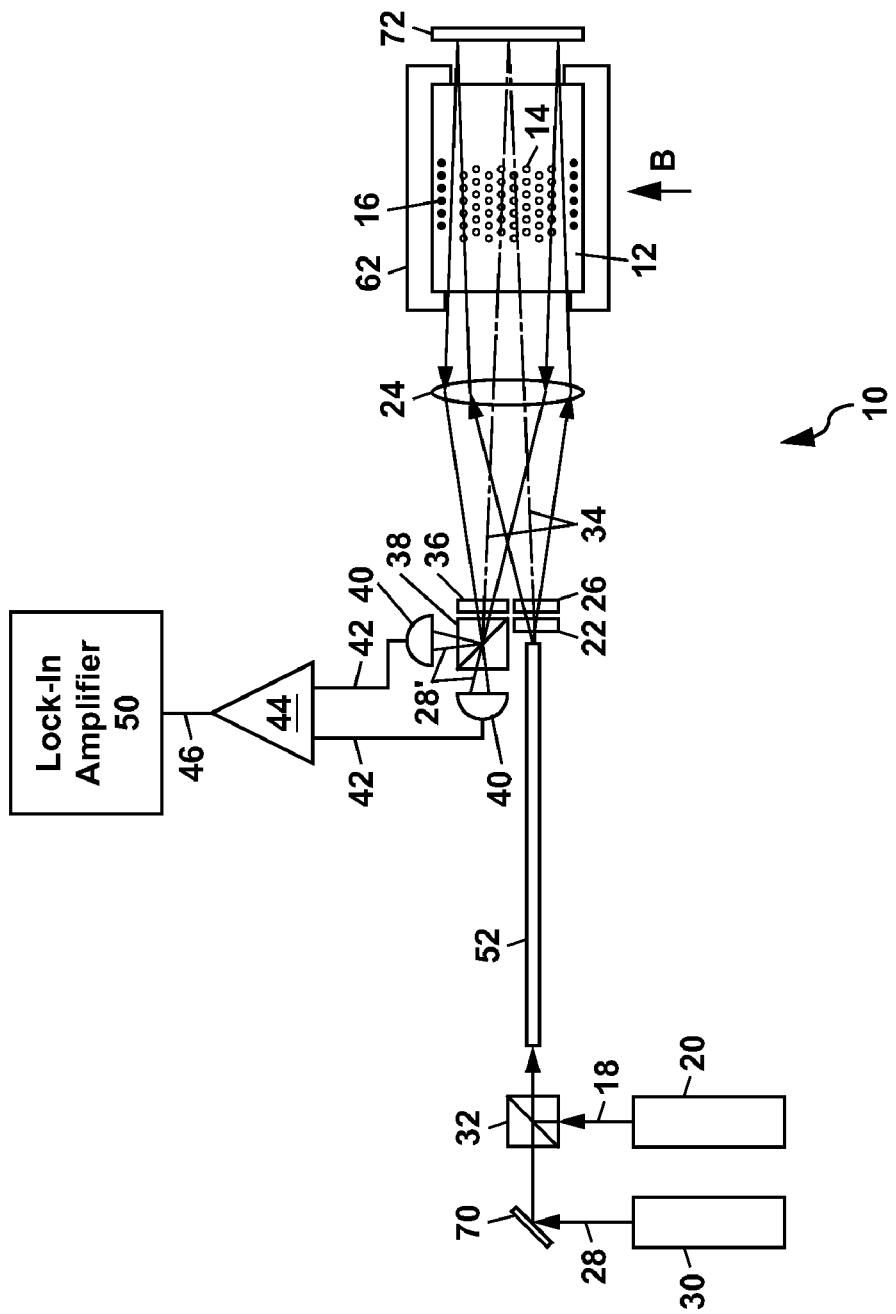
FIG. 4 shows a schematic diagram of a third example of the atomic magnetometer of the present invention.

FIG. 4 shows a schematic diagram of a third example of the atomic magnetometer 10 of the present invention. In the example of FIG. 4, the pump light beam 18 and the probe light beam 28 can be generated by different lasers 20 and 30, respectively, and can be coupled into a single optical fiber 52 for delivery into the magnetometer 10. Combining the pump and probe light beams 18 and 28 for coupling into the optical fiber 52 can be performed, for example, a turning mirror 70 and a dichroic prism beamsplitter 32. At the exit end of the optical fiber 52, the pump and probe light beams 18 and 28 can be linearly polarized, if needed, using a linear polarizer 22.

The pump and probe light beams 18 and 28, which are collinear and diverging upon exiting the optical fiber 52, are directed through an optical waveplate 26 prior to collimating the beams 18 and 28 with a lens 24. As described previously, the optical waveplate 26 can comprise a high-order optical waveplate which functions as a quarter waveplate at the wavelength of the pump light beam 18 (e.g. a D1- or D2-line wavelength) and simultaneously functions as a half waveplate at the wavelength of the probe light beam 28 (e.g. a D2- or D1-line wavelength). This converts the linearly-polarized pump light beam 18 into a circularly-polarized beam 18 after transmission through the optical waveplate 26, while maintaining the probe light beam 28 in a linear polarization state albeit with a polarization direction which is rotated by 90°. The circularly-polarized pump light beam 18 magnetically polarizes the atoms of the alkali metal vapor 14 while the linearly-polarized probe light beam 28 is used to sense a polarization rotation of the beam 28 which is produced by the magnetic field B being sensed by the magnetometer 10.

In the atomic magnetometer 10 of FIG. 4, a light reflector 72 (e.g. a mirror) is used after the cell 12 to provide a folded optical path 34 for the pump and probe light beams 18 and 28. Upon reflection, the pump and probe light beams 18 and 28 are transmitted back through the cell 12 for a second time. It should be noted that when the reflector 72 is a mirror, the mirror will reverse the handedness of the circular-polarized pump light beam 18 (e.g. from being right-hand circularly polarized to being left-hand circularly polarized or vice versa) for the second pass through the cell 12 containing the alkali metal vapor 14. However, since the direction of propagation of the pump light beam 18 after reflection by the mirror is also reversed, both passes of the pump light beam 18 through the cell 12 will magnetically polarize the alkali metal atoms in the same direction and thus are additive to double the angle of rotation of the linearly-polarized probe light beam 28 due to the magnetic field B being sensed. When other types of light reflectors 72 including reflecting prisms or gratings are used in the magnetometer 10, the effect of these other types of light reflectors 72 on the circular polarization of the pump light beam 18 must be taken into account to ensure that the magnetic polarization of the alkali metal atoms for each pass through the cell 12 will be additive.

By offsetting the pump and probe light beams 18 and 28 with respect to the center of the lens 24, these beams 18 and 28 can be directed onto the reflector 72 slightly off normal incidence so that the two arms of the folded optical path 34 are offset slightly from each other. This provides room for an optical filter 54 to be located adjacent to the optical fiber 52 near a terminus of the folded optical path 34 as shown in FIG. 4.

The optical filter 54 can comprise an optical interference filter 36 which transmits the probe light beam 28 and rejects (i.e. blocks the transmission of) the pump light beam 18. The optical filter 54 can further include a polarization beamsplitter 38 which can be oriented at a 45° angle with respect to the polarization state of the probe light beam 28 in the absence of any magnetic field B. The polarization beamsplitter 38 can be used to divide the probe light beam 18 into two substantially equal portions 28' in the absence of any magnetic field B, with each portion 28' being directed into a different photodetector 40. Each photodetector 40 produces an electrical signal 42 upon detecting the portion 28' of the probe light beam 28 which is incident onto that photodetector 40. The two electrical signals 42 can then be input into a transimpedance amplifier 44 to provide an output voltage signal 46 which is balanced (i.e. nulled) in the absence of any magnetic field B and which substantially reduces common-mode noise in the atomic magnetometer 10 to increase the sensitivity of the atomic magnetometer 10 to a few femtoTesla per root Hertz (fT/Hz$^{1/2}$). This sensitivity is one to two orders of magnitude less than typical bio-magnetic fields which are produced by a human brain.

In other embodiments of the present invention which utilize a single photodetector 40 or 40', a linear polarizer can be substituted for the polarization beamsplitter 38. In these embodiments, the linear polarizer can be oriented at an angle substantially equal to 90° with respect to the linear polarization of the probe light beam 28 in the absence of any magnetic field B. In this orientation, the linear polarizer is crossed with respect to the probe light beam 28 so that little, if any, of the probe light beam 28 is detected by the photodetector 40 or 40' in the absence of any magnetic field B. When a magnetic field B is present, the amount of the probe light beam 28 which is detected by the photodetector 40 or 40' will increase in proportion to the magnitude of the magnetic field B due to the Faraday rotation of the probe light beam 28. When a multi-element photodetector 40' is used in these embodiments, common-mode noise and common-mode magnetic fields can be substantially reduced or cancelled out by differencing the signals 42 from adjacent detector elements 56 using a transimpedance amplifier 44. The sensitivity of these embodiments can be further increased by modulating the signals 42 using the coils 48 or a polarization modulator (not shown) so that phase sensitive detection with a lock-in amplifier 50 can be used.

In the atomic magnetometer 10 of FIG. 4, one or more sets of coils 48 can be provided about the cell 12 as previously described with reference to FIG. 1. These coils 48 can be used to cancel out unwanted residual magnetic fields. The coils 48 can also be electrically activated with an alternating current to modulate the signals 42 and 46 so that phase sensitive detection with a lock-in amplifier 50 can be used. Additionally, magnetic shielding comprising one or more layers of a high-permeability material such as mumetal can be provided about the cell 12 for shielding of the unwanted residual magnetic fields. In some cases, the atomic magnetometer 10 can be located in a magnetically-shielded room so that additional magnetic shielding is not necessary. Reducing the unwanted residual magnetic fields to a low level allows the atomic magnetometer to be operated in a spin-exchange-relaxation-free (SERF) mode to provide a high sensitivity for detecting magnetic fields B.

Figure 5:
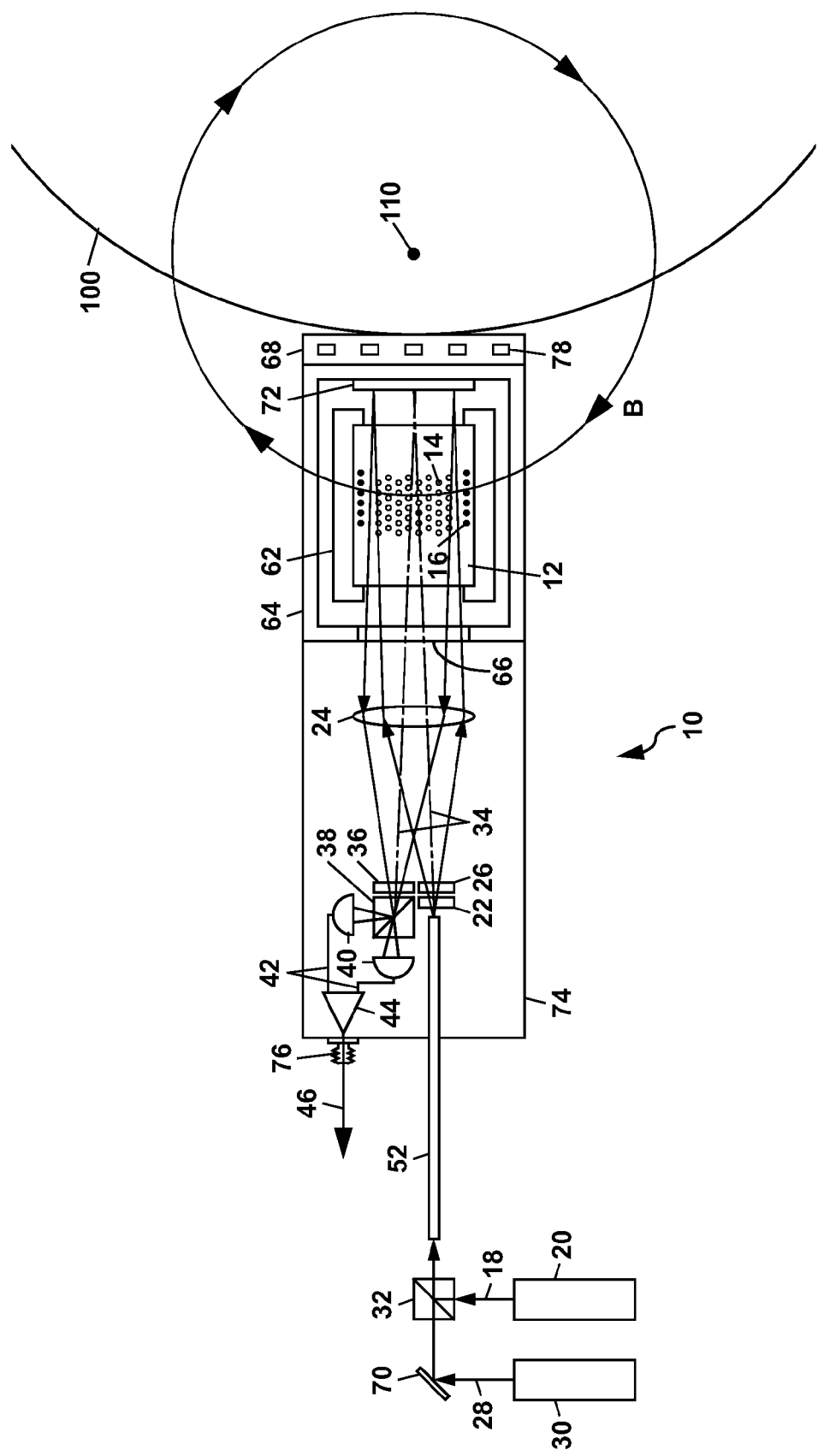
FIG. 5 shows a schematic diagram of a fourth example of the atomic magnetometer of the present invention.

FIG. 5 shows a fourth example of the atomic magnetometer 10 of the present invention. This fourth example of the magnetometer 10 is similar to that of FIG. 4 and further includes an evacuated enclosure 64 with a window 66. This enclosure 64 prevents air convection currents in the optical path 34 to reduce 1/f noise and improve the sensitivity of the atomic magnetometer 10. In this example of the present invention, the various elements 22, 24, 26, 36, 38, 40 and 44 can be located within another enclosure 74 which can be attached to the evacuated enclosure 64. This enclosure 74 can include one or more connectors 76 to make electrical connections to the oven 62, photodetectors 40 and transimpedance amplifier 44. Additional connectors 76 can be optionally used for the optical fiber used to couple the pump and probe light beams 18 and 28 into the magnetometer 10. In some embodiments of the present invention, the enclosures 64 and 74 can be combined as a single enclosure which can be evacuated and sealed. This can eliminate the need for the window 66 in FIG. 5.

In the example of FIG. 5, which can be used for bio-magnetic field sensing, active cooling of an end-surface of the evacuated enclosure 64 may not be necessary. However, active cooling can be optionally provided by a fluid-cooled member 68 which can be formed, for example, from silicon rubber or a polydimethylsiloxane (PDMS) elastomer. The fluid-cooled member 68 includes a plurality of channels 78 through which a cooling fluid such as water can be flowed. This active cooling ensures that a side of the member 68, which contacts a human or animal patient's body 100 to sense a bio-magnetic field B generated at a point 110 within the body 100, will be at a temperature near the patient's body temperature (e.g. on the order of 100° F.) and thereby prevent any discomfort or injury to the patient.

Figure 6:
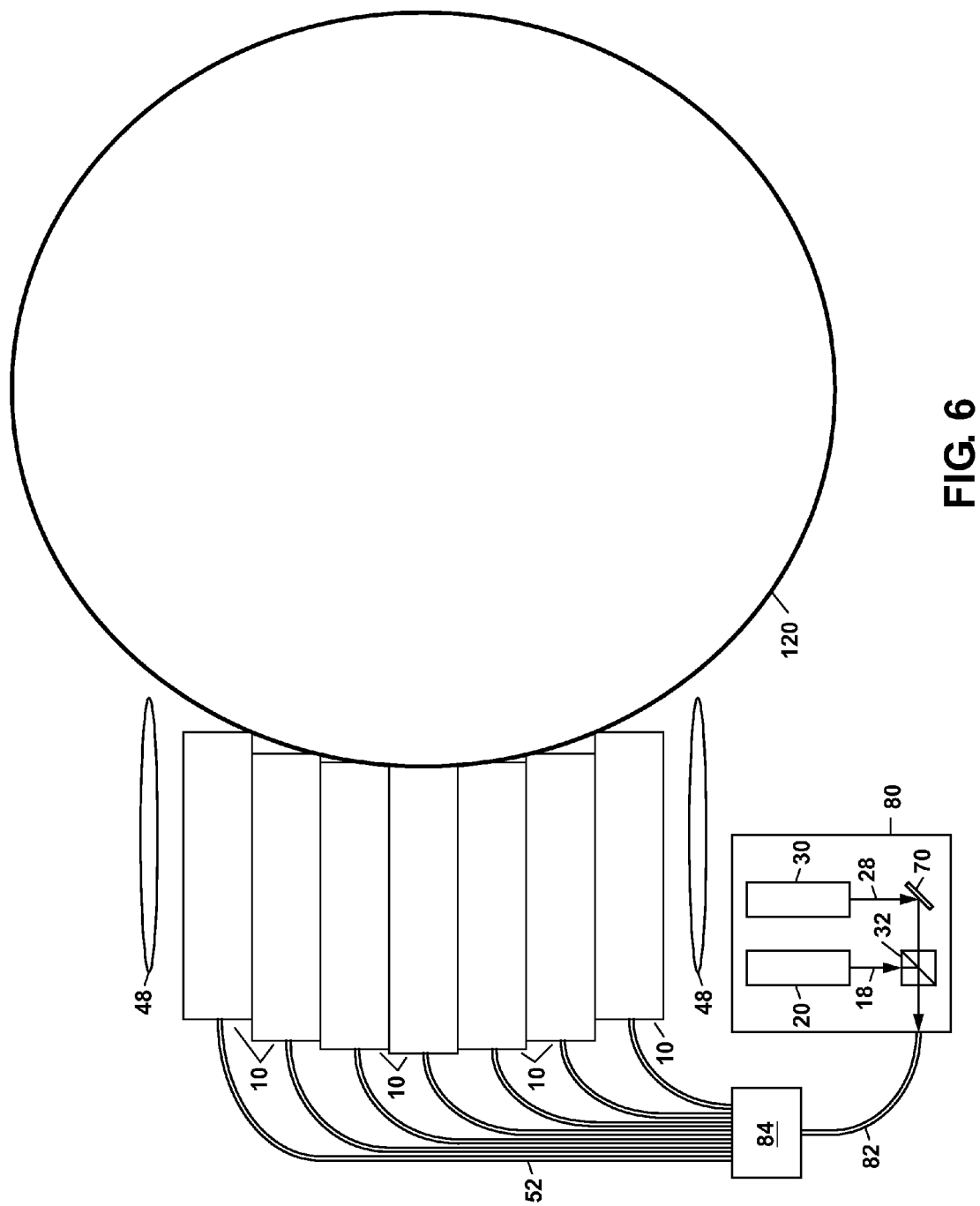
FIG. 6 shows a parallel arrangement of a plurality of the atomic magnetometers of the present invention.

A plurality of atomic magnetometers 10 of the present invention can be used in tandem to provide a magnetic field mapping. This is useful, for example to sense and analyze bio-magnetic fields in the heart or brain. This is schematically illustrated in FIG. 6 which shows a plurality of atomic magnetometers 10 similar to the example of FIG. 5 arranged about a human or animal patient's head 120 with the magnetometers 10 being arranged substantially parallel to each other in one or two dimensions. Each magnetometer 10 can have lateral dimensions of, for example, from about two inches down to about one-half inch, and a length of a few inches or less.

The parallel arrangement of FIG. 6 is useful to allow one or more sets of coils 48, which are common to the magnetometers 10, to be used to modulate the signals 42 produced by the photodetectors 40 so that phase sensitive detection can be used. This parallel arrangement also eliminates fringing magnetic fields which could be produced if different coils 48 were to be used for each magnetometer 10. Such fringing magnetic fields produced by different coils 48 for each magnetometer 10 could lead to cross-talk which would complicate the signal processing needed for the output voltage signal 46 from each magnetometer 10.

In the example of FIG. 6, a single pump laser 20 and a single probe laser 30 can be used to generate all of the pump and probe light beams 18 and 28, respectively, for a number N of magnetometers 10. These lasers 20 and 30 and associated optics 32 and 70 can be located in a housing 80 which is separate from the magnetometers 10 with the pump and probe light beams 18 and 28 being coupled into the magnetometers 10 using a plurality of optical fibers 52. A common optical fiber 82 can be used to couple the pump and probe light beams 18 and 28 from the lasers 20 and 30 into a 1×N fiber optic splitter 84 which splits the beams 18 and 28 into N separate beams and couples these N separate beams through N optical fibers 52 into the N magnetometers 10. Lasers 20 and 30 are commercially available with sufficient optical power to operate up to tens or hundreds of separate magnetometers 10.

As an alternative to the 1×N fiber optic splitter 84 in FIG. 6, a plurality of 1×2 fiber optic splitters can be used and connected in series to provide the N separate beams for the N magnetometers 10. As yet another alternative, a plurality of beamsplitters can be used to split the pump and probe light beams 18 and 28 to form the N separate beams for the N magnetometers 10, with each of the N beams then being coupled through an optical fiber 52 to a different magnetometer 10.

Figure 7:
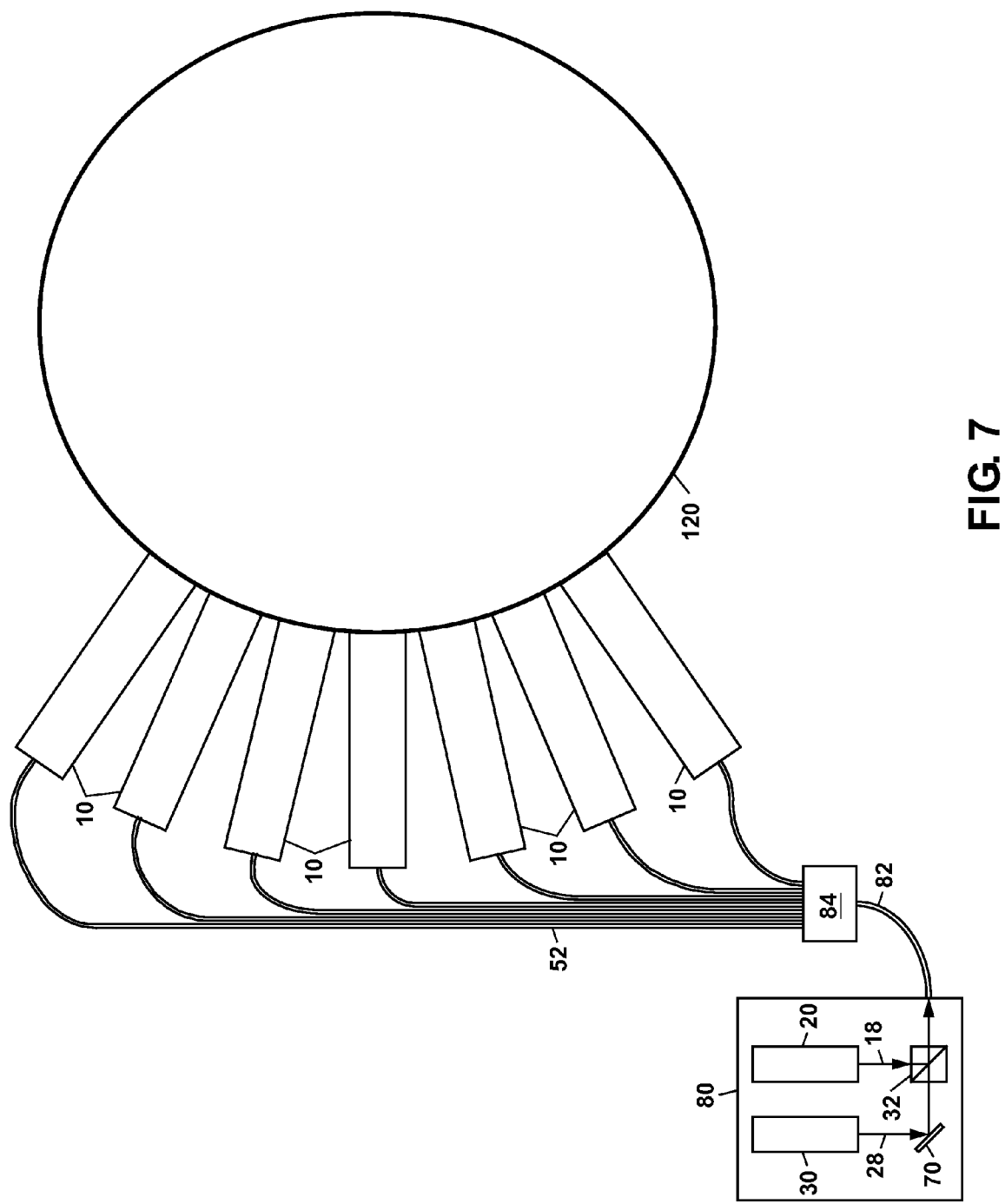
FIG. 7 shows a substantially-radial arrangement for a plurality of the atomic magnetometers of the present invention.

FIG. 7 shows another arrangement that can be used for a plurality of atomic magnetometers 10 of the present invention. In the example of FIG. 7, the atomic magnetometers are arranged substantially radially about a human or animal patient's head 120. The magnetometers 10 in this example and the example of FIG. 6 can be attached together as a unit to provide for positioning of the magnetometers 10. This can be done, for example, by attaching the magnetometers 10 to a helmet or other type of pre-positioning fixture. Attaching the magnetometers 10 together as a unit can be advantageous for bio-magnetic sensing since this can allow a patient to move while measuring bio-magnetic fields within the patient's heart, brain, or other organs. In the examples of FIGS. 5-7, multi-element photodetectors 40' can be substituted for the single-element photodetectors 40 to provide an increased spatial resolution and to allow the magnetometers 10 to be operated as gradiometers.

The atomic magnetometers 10 described herein can also be used for other types of applications including non-destructive testing. The matter set forth in the foregoing description and accompanying drawings is offered by way of illustration only and not as a limitation. The actual scope of the invention is intended to be defined in the following claims when viewed in their proper perspective based on the prior art.

What is claimed is:

1. An atomic magnetometer for sensing a magnetic field, comprising:
    a cell containing an alkali metal vapor;
    a pump light beam having a first wavelength which is substantially equal to the wavelength of a first D-line atomic transition of the alkali metal vapor, and with the pump light beam being directed through an optical waveplate and through the cell containing the alkali metal vapor to magnetically polarize the alkali metal vapor;
    a probe light beam having a second wavelength which is different from the first wavelength, with the second wavelength being substantially equal to the wavelength of a second D-line atomic transition of the alkali metal vapor, and with the probe light beam being directed through the optical waveplate and through the cell containing the alkali metal vapor to undergo a change in polarization due to the magnetic field;
    an optical filter located in a path of the pump light beam and the probe light beam, with the optical filter blocking transmission of the pump light beam and transmitting the probe light beam; and
    at least one photodetector to detect the probe light beam after transmission through the optical filter and to generate therefrom an electrical signal which depends upon the change in polarization of the probe light beam due to the magnetic field.

2. The atomic magnetometer of claim 1 wherein the pump light beam and the probe light beam are directed in substantially the same direction through the cell containing the alkali metal vapor.

3. The atomic magnetometer of claim 1 wherein the path of the pump light beam and the probe light beam is a folded optical path, and further comprising an optical reflector located proximate to the cell to re-direct the pump light beam and the probe light beam along the folded optical path to the optical filter.

4. The atomic magnetometer of claim 1 wherein the alkali metal vapor is selected from the group of alkali metals consisting of sodium, potassium, rubidium and cesium.

5. The atomic magnetometer of claim 1 wherein the pump light beam is provided by a laser and is coupled through an optical fiber prior to being directed through the optical waveplate and through the cell containing the alkali metal vapor.

6. The atomic magnetometer of claim 5 wherein the probe light beam is provided by another laser and is coupled through the same optical fiber or a different optical fiber prior to being directed through the optical waveplate and through the cell containing the alkali metal vapor.

7. The atomic magnetometer of claim 1 wherein the pump light beam and the probe light beam are both linearly polarized prior to being directed through the optical waveplate, with the pump light beam being circularly-polarized after transmission through the optical waveplate, and with the probe light beam remaining linearly polarized after transmission through the optical waveplate.

8. The atomic magnetometer of claim 1 wherein the optical waveplate is a high-order optical waveplate which functions as a quarter waveplate at the first wavelength and as a half waveplate at the second wavelength.

9. The atomic magnetometer of claim 1 further comprising a lens to substantially collimate the pump light beam and the probe light beam prior to entry of the pump light beam and the probe light beam into the cell.

10. The atomic magnetometer of claim 1 wherein the optical filter comprises an optical interference filter.

11. The atomic magnetometer of claim 10 wherein the optical filter further comprises a polarization beamsplitter.

12. The atomic magnetometer of claim 1 wherein the cell is located within an oven.

13. The atomic magnetometer of claim 12 wherein the oven is located inside of an evacuated enclosure.

14. The atomic magnetometer of claim 1 wherein each photodetector is a multi-element photodetector.

15. The atomic magnetometer of claim 1 further comprising at least one set of magnetic coils located about the cell containing the alkali metal vapor.

16. An atomic magnetometer for sensing a magnetic field, comprising:
a cell containing an alkali metal vapor;
a pump light beam having a first wavelength which is substantially equal to the wavelength of a first D-line atomic transition of the alkali metal vapor, and with the pump light beam being directed along an optical path through an optical waveplate and through the cell containing the alkali metal vapor, and with the pump light beam being circularly polarized by the optical waveplate to magnetically polarize the alkali metal vapor;
a probe light beam having a second wavelength which is different from the first wavelength, with the second wavelength being substantially equal to the wavelength of a second D-line atomic transition of the alkali metal vapor, and with the probe light beam being directed along the optical path through the optical waveplate and through the cell containing the alkali metal vapor, and with the probe light beam being linearly polarized after transmission through the optical waveguide, and with the alkali metal vapor in response to the magnetic field changing a polarization angle of the linearly-polarized probe light beam;
a light reflector located in the optical path to reflect the pump light beam and the probe light beam back through the cell containing the alkali metal vapor to an optical filter which transmits the probe light beam and blocks the pump light beam; and
at least one photodetector to detect the change in the polarization angle of the linearly-polarized light beam and thereby determine an intensity of the magnetic field.

17. The atomic magnetometer of claim 16 wherein the alkali metal vapor comprises an alkali metal selected from the group consisting of sodium, potassium, rubidium and cesium.

18. The atomic magnetometer of claim 16 wherein the pump light beam is provided by a laser and is coupled through an optical fiber to the optical path.

19. The atomic magnetometer of claim 18 wherein the probe light beam is provided by another laser and is coupled through the same optical fiber or through a different optical fiber to the optical path.

20. The atomic magnetometer of claim 19 wherein the pump light beam and the probe light beam are both linearly polarized by a linear polarizer after exiting the optical fiber and before being directed through the optical waveplate.

21. The atomic magnetometer of claim 16 further comprising a lens located within the optical path to substantially collimate the pump light beam and the probe light beam prior to entry of the pump light beam and the probe light beam into the cell.

22. The atomic magnetometer of claim 16 wherein the optical waveplate is a high-order optical waveplate which functions as a quarter waveplate at the first wavelength and as a half waveplate at the second wavelength.

23. The atomic magnetometer of claim 16 wherein the optical filter comprises an optical interference filter.

24. The atomic magnetometer of claim 23 wherein the optical filter further comprises a polarization beamsplitter.

25. The atomic magnetometer of claim 16 wherein the cell is located inside of an oven.

26. The atomic magnetometer of claim 25 wherein the oven is located within an evacuated enclosure.

27. The atomic magnetometer of claim 16 wherein each photodetector is a multi-element photodetector.

28. An atomic magnetometer for sensing a magnetic field, comprising:
a cell containing an alkali metal vapor;
an optical fiber emitting a pump light beam and a probe light beam from an exit end of the optical fiber, with the emitted pump and probe light beams being collinear and directed along an optical path through the cell, and with the pump light beam having a wavelength substantially equal to the wavelength of a first D-line atomic transition of the alkali metal vapor, and with the wavelength of the probe light beam being substantially equal to the wavelength of a second D-line atomic transition of the alkali metal vapor;
a lens located in the optical path of the pump and probe light beams to substantially collimate the pump and probe light beams prior to entry of the pump and probe light beams into the cell;
an optical waveplate located in the optical path of the pump and probe light beams, with the optical waveplate functioning as a quarter waveplate at the wavelength of the first D-line atomic transition of the alkali metal vapor and as a half waveplate at the wavelength of the second D-line atomic transition of the alkali metal vapor;
a light reflector located in the optical path on a side of the cell opposite the optical fiber to reflect the pump and probe beams back through the cell to an optical filter which transmits the probe light beam and blocks the pump light beam; and
at least one photodetector to detect the probe light beam after transmission through the optical filter and to generate therefrom an electrical signal which depends upon the magnetic field.

29. The atomic magnetometer of claim 28 wherein the cell is located inside of an oven.

30. The atomic magnetometer of claim 29 wherein the oven is located inside of an evacuated enclosure.

31. The atomic magnetometer of claim 30 further comprising a fluid-cooled member in contact with an outer surface of the evacuated enclosure.

32. The atomic magnetometer of claim 28 wherein the alkali metal vapor comprises an alkali metal selected from the group consisting of sodium, potassium, rubidium and cesium.

33. The atomic magnetometer of claim 28 wherein the pump light beam is generated by a first laser, and the probe light beam is generated by a second laser.

34. The atomic magnetometer of claim 28 wherein each photodetector is a multi-element photodetector.

35. The atomic magnetometer of claim 28 further comprising at least one set of magnetic coils located about the cell to modulate an interaction between the magnetic field and the alkali metal vapor and thereby modulate the electrical signal generated by each photodetector.

* * * * *